United States Patent
Nair (10) Patent No.: US 6,910,197 B2
(45) Date of Patent: Jun. 21, 2005

(54) SYSTEM FOR OPTIMIZING BUFFERS IN INTEGRATED CIRCUIT DESIGN TIMING FIXES

(75) Inventor: Umesh Nair, Newark, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 91 days.

(21) Appl. No.: 10/600,740

(22) Filed: Jun. 20, 2003

(65) Prior Publication Data

US 2004/0261046 A1 Dec. 23, 2004

(51) Int. Cl.$^7$ .............................................. G06F 17/50
(52) U.S. Cl. .................................. 716/6; 716/2; 716/10
(58) Field of Search ............................... 716/1–2, 4–6, 716/9–13

(56) References Cited

U.S. PATENT DOCUMENTS

| | | | |
|---|---|---|---|
| 5,623,608 A | 4/1997 | Ng ............................. | 395/250 |
| 5,958,027 A | 9/1999 | Gulick ......................... | 710/52 |
| 6,392,747 B1 | 5/2002 | Allen et al. ................. | 356/141.1 |
| 6,550,045 B1 | 4/2003 | Lu et al. ...................... | 716/6 |
| 2004/0123261 A1 * | 6/2004 | Alpert et al. ................. | 716/13 |

* cited by examiner

Primary Examiner—Vuthe Siek
Assistant Examiner—Paul Dinh
(74) Attorney, Agent, or Firm—Hamilton & Terrile, LLP; Stephen A. Terrile (57) ABSTRACT

A method for optimizing buffers in an integrated circuit design. The method includes identifying paths and nodes within the integrated circuit design, determining node overlap within the integrated circuit design, calculating possible solutions for addressing timing violations within the integrated circuit design, choosing a solution for addressing timing violations, inserting buffers at particular nodes of the integrated circuit design, and repeating the calculated possible solutions wherein choosing a solution and inserting buffers at particular nodes to address timing violations are within the integrated circuit design.

18 Claims, 6 Drawing Sheets

|        | A | B | C | D | E |
|--------|---|---|---|---|---|
| Path 1 | X | X |   | X | X |
| Path 2 | X | X | X |   | X |

Figure 3

|        | A | B | C | D | E | F |
|--------|---|---|---|---|---|---|
| Path 1 | X |   | X | X | X | X |
| Path 2 | X | X |   |   |   |   |

Figure 4

|        | A | B | C | D | E | F |
|--------|---|---|---|---|---|---|
| Path 1 | X |   | X | X |   |   |
| Path 2 | X | X |   | X | X | X |
| Path 3 |   |   |   |   |   | X |

SYSTEM FOR OPTIMIZING BUFFERS IN INTEGRATED CIRCUIT DESIGN TIMING FIXES

BACKGROUND OF THE INVENTION

The present invention relates to the field of integrated circuits and more particularly to optimizing buffers used for minimum timing (often referred to as mintiming) fixes.

Known integrated circuit chips contain a large number of transistors and interconnections. Given the large number of devices and ever-increasing chip operating frequency, full chip timing analysis and timing convergence is a challenge when designing the integrated circuit chip. This design issue becomes even more challenging because every incremental change to the integrated circuit design effects both maximum timing (often referred to as maxtiming) and minimum timing paths.

Figure 1:
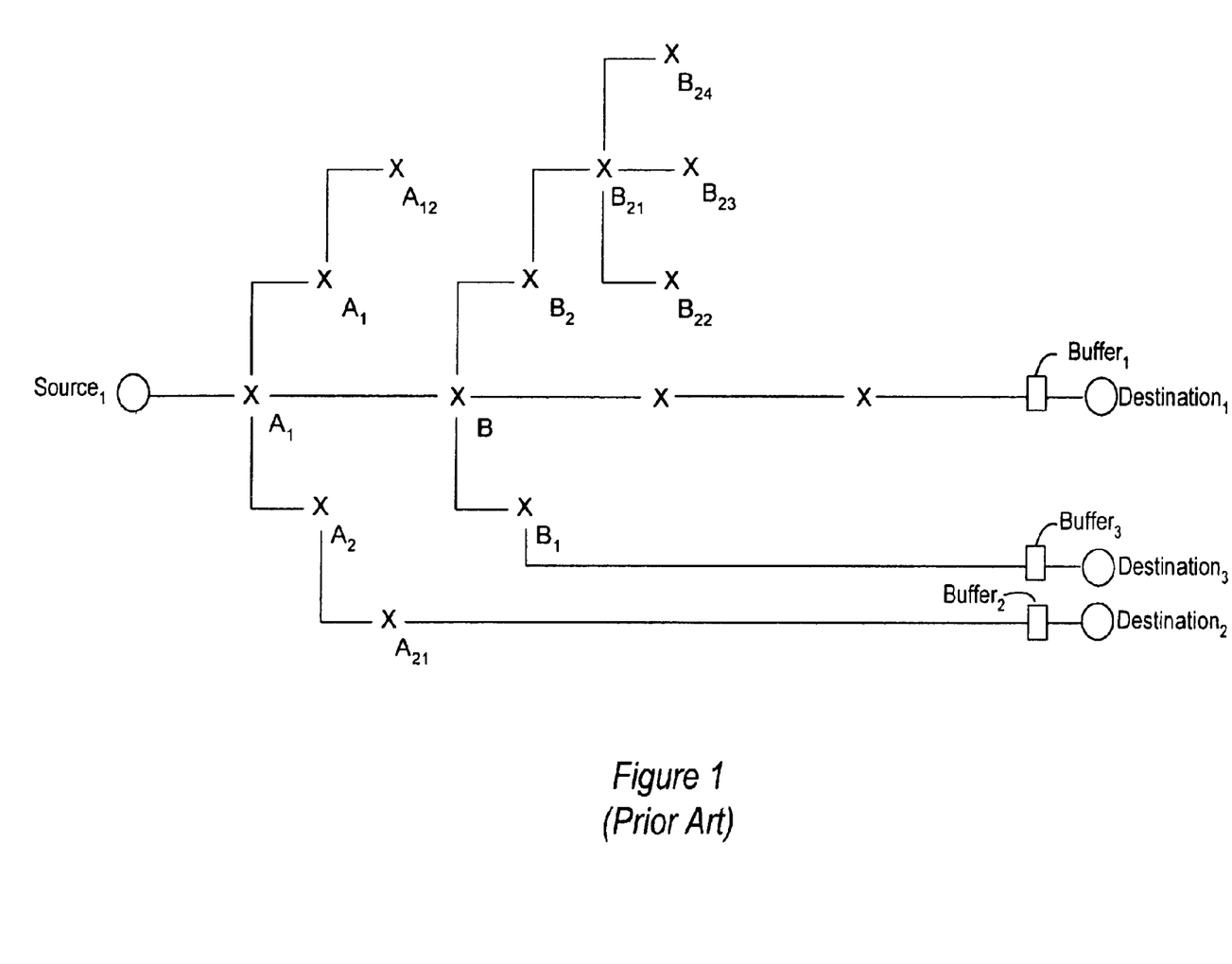
FIG. 1, labeled prior art, shows an example of an integrated circuit design including buffers for addressing timing failures.

For example, FIG. 1, labeled prior art, shows a simplified example of some of the issues relating to inserting buffers into an integrated circuit design to address minimum timing issues. More specifically, an integrated circuit design includes a plurality of sources (e.g., source 1), a plurality of destinations, (e.g., destination 1, destination 2 and destination 3). Between the sources and destinations are a plurality of nodes (designated by "x") as well as a plurality of paths between the sources and the nodes, between the nodes and other nodes and between the nodes and the destinations. With an actual integrated circuit design there are many sources and destinations and massive numbers of nodes and paths.

Each of the nodes includes an associated time slot. A time slot is a continuously repeating interval of time in which two nodes are able to communicate. When the timing at a particular node is either too fast (i.e., a signal arrives at a node before the node's time slot) or too slow (i.e., a signal arrives at a node after the node's time slot), then the node is said to have either a maximum time failure or a minimum time failure, respectively.

In known systems, buffers (e.g., buffer 1) are placed close to each of the destinations within the integrated circuit to address the minimum time failures for that particular destination. In some cases the addition of buffers might cause maxtime failures. In integrated circuit design, timing convergence is tedious and prolonged due to the incremental nature of the timing fixes. A system which automates the process of addressing timing issues within an integrated circuit design, the system reduces the design cycle for timing convergence. The algorithm implemented within the system provides a fast and efficient way to resolve timing issues. Because the buffers address a wide range of timing and electrical issues, many different types of buffers are often used within a single integrated circuit design to address the timing issues.

SUMMARY OF THE INVENTION

In one embodiment, the invention relates to a method for optimizing buffers in an integrated circuit design. The method includes identifying paths and nodes within the integrated circuit design, determining node overlap within the integrated circuit design, calculating possible solutions for addressing timing violations within the integrated circuit design, choosing a solution for addressing timing violations, inserting buffers at particular nodes of the integrated circuit design, and repeating the calculated possible solutions wherein choosing a solution and inserting buffers at particular nodes to address timing violations are within the integrated circuit design.

In another embodiment, the invention relates to an apparatus for optimizing buffers in an integrated circuit design. The apparatus includes means for identifying paths and nodes within the integrated circuit design, means for determining node overlap within the integrated circuit design, means for calculating possible solutions for addressing timing violations within the integrated circuit design, means for choosing a solution for addressing timing violations, means for inserting buffers at particular nodes of the integrated circuit design, and means for repeating the calculated possible solutions. Choosing a solution and the inserting buffers at particular nodes to address timing violations are within the integrated circuit design.

In another embodiment, the invention relates to a system for optimizing buffers in an integrated circuit design. The system includes an identifying module, a determining module, a calculating module, a choosing module, and a repeating module. The identifying module identifies paths and nodes within the integrated circuit design. The determining module determines node overlap within the integrated circuit design. The calculating module calculates possible solutions for addressing timing violations within the integrated circuit design. The choosing module chooses a solution for addressing timing violations. An inserting module inserts buffers at particular nodes of the integrated circuit design. A repeating module repeats the calculated possible solutions. Choosing a solution and inserting buffers at particular nodes to address timing violations are within the integrated circuit design.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 2:
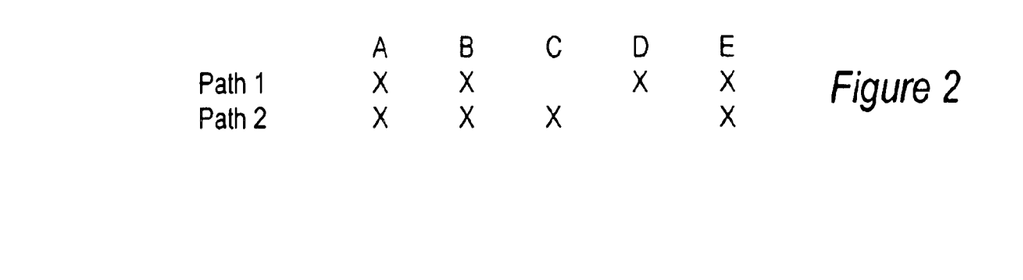
FIG. 2 shows an example of paths and nodes within an integrated circuit design represented in tabular format for ease of understanding.

Referring to FIG. 2, an example of paths and nodes within an integrated circuit design is shown. In this example, each column (e.g., A, B, C, D, E) represents a node in the integrated circuit design and each horizontal row (e.g., PATH1, PATH2) represents a path through the integrated circuit design. For this example it is assumed that mintime buffers can be inserted at any node and inserting a buffer at any node in the path fixes the minimum timing violation.

The method for optimizing mintime fixes determines any common intersection of the two paths. More specifically, Function F(x) is the final solution and S(pathn) is the solution for path n.

$$F(x)=S(path1) \text{ intersection } S(path2)=A, B, F$$

Accordingly, for the example set forth in FIG. 2, a single buffer may be inserted at nodes A, B or F to fix the minimum time failure.

Figure 3:
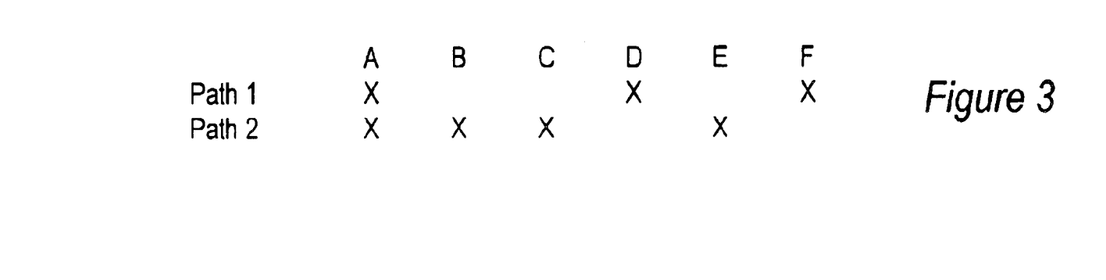
FIG. 3 shows another example of paths and nodes within an integrated circuit design.

Referring to FIG. 3, another example of paths and nodes within an integrated circuit design is shown. In this example, each column (e.g., A, B, C, D, E) represents a node in the integrated circuit design and each horizontal row (e.g., PATH1, PATH2) represents a path through the integrated circuit design. For this example it is assumed that mintime buffers can be inserted at any node and inserting a buffer at any node in the path fixes the minimum timing violation.

$$\text{In this example, } F(x)=S(path1) \text{ intersection } S(path2)=A.$$

Accordingly, for the example set forth in FIG. 3 there is a single intersection at which a buffer may be inserted to fix the minimum time failure for both paths.

Figure 4:
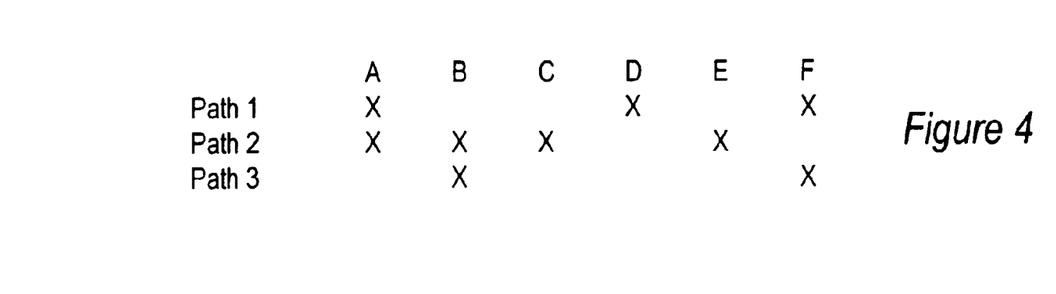
FIG. 4 shows another example of paths and nodes within an integrated circuit design.

Referring to FIG. 4, another example of paths and nodes within an integrated circuit design is shown. In this example, each column (e.g., A, B, C, D, E, F) represents a node in the integrated circuit design and each horizontal row (e.g., PATH1, PATH2, PATH3) represents a path through the integrated circuit design. For this example it is assumed that mintime buffers can be inserted at any node and inserting a buffer at any node in the path fixes the minimum timing violation.

In this example, there is no solution in which F(x)=S(path1) intersection S(path2) intersection S(path3). However, there are multiple solutions for addressing sub-combinations of the paths. More specifically, the minimum timing failures of Path1 and Path2 may be fixed by inserting a buffer at node A. The minimum timing failures of Path1 and Path3 may be fixed by inserting a buffer at node F. The minimum timing failures of Path2 and Path3 may be fixed by inserting a buffer at node B. Accordingly, the minimum timing failures of all three paths may be fixed inserted at either nodes A and F or nodes B and F.

Figure 5:
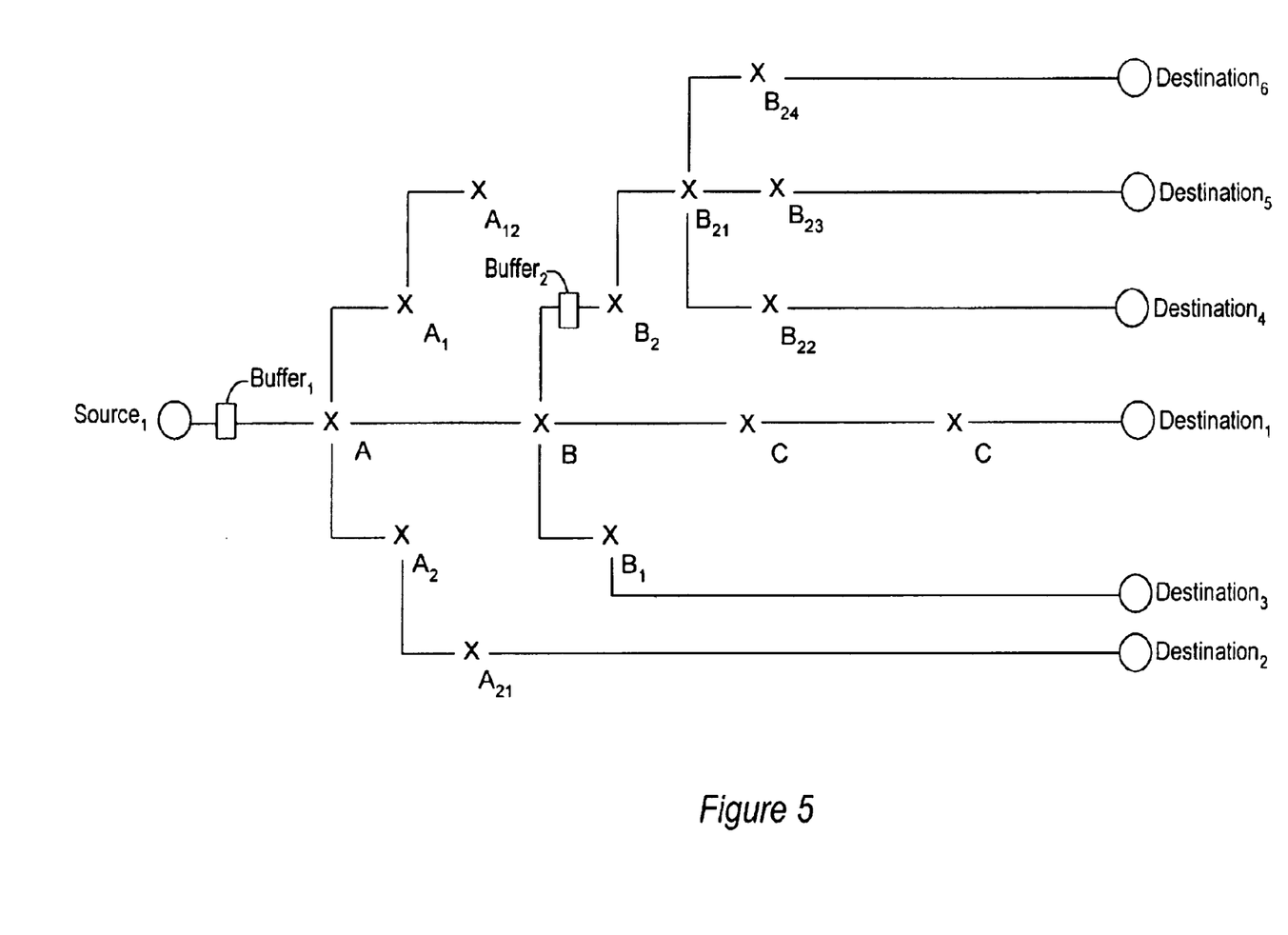
FIG. 5 shows an example of an integrated circuit including optimized buffers for addressing timing failures.

Referring to FIG. 5, an example of an integrated circuit including optimized buffers for addressing timing failures is shown. More specifically, after the system for optimizing buffers in an integrated circuit design is executed, it might be determined that inserting buffers at nodes A and B2 fix all minimum timing failures for the exemplative integrated circuit. Additionally, because buffer 1 is within the path from source 1 to destinations 4, 5 and 6, the effect of the delay imposed by buffer 1 is cumulative to the delay imposed by buffer 2. Accordingly, the size of buffer b2 is reduced due to the size of buffer b1.

Figure 6:
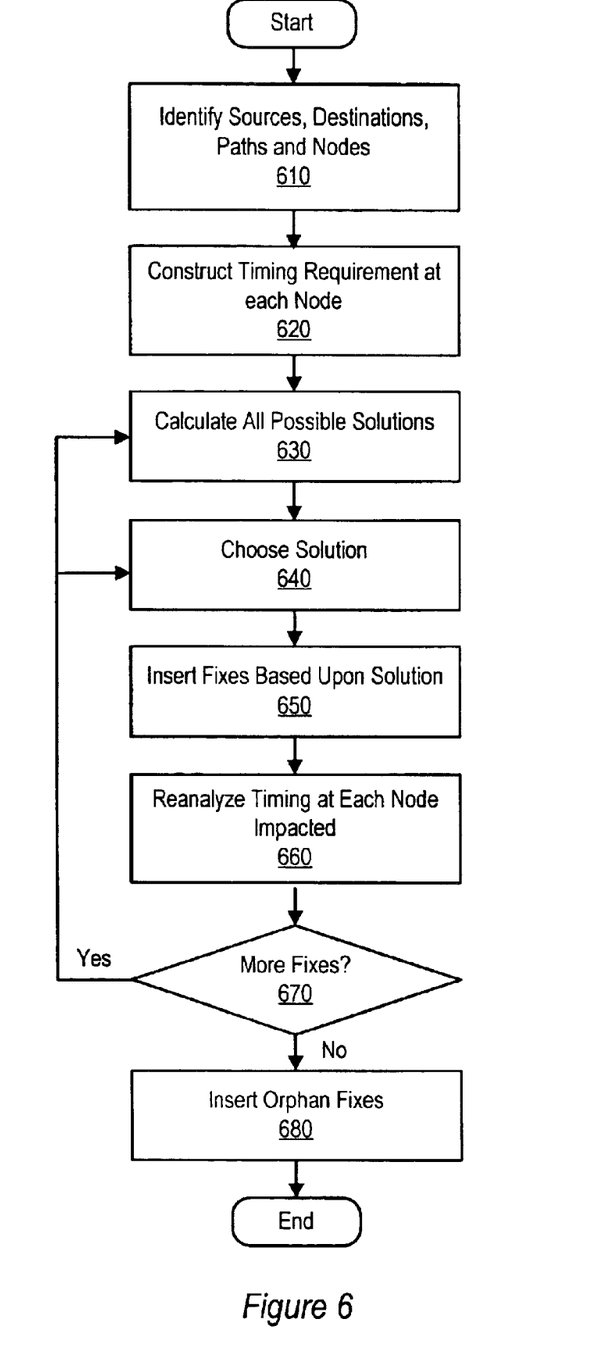
FIG. 6 shows a flow chart of the operation of a method for optimizing integrated circuit design timing fixes.

Referring to FIG. 6, a flow chart of the operation of a method for optimizing integrated circuit design timing fixes is shown. More specifically, when optimizing integrated circuit design timing fixes, the system first identifies sources, destinations, paths and nodes within the integrated circuit design at step 610. Next, the integrated circuit design is analyzed to determine the mintiming and maxtiming criteria at each node and construct the complete graph of the network at step 620. Next, the system calculates substantially all possible solutions to fix the minimum time failures at step 630. It will be appreciated that "all" possible solutions may be so large a number as to be impractical to calculate. Accordingly, substantially all possible solutions is defined as a plurality of different combinations of solutions that address substantially all of the timing failures.

After the possible solutions are calculated, then a solution is chosen at step 640. The solution is chosen so as to fix a plurality of the timing failures based on various input criteria. At this stage, certain solutions are also further optimized. After the solution is chosen, then the fixes based upon the solution are inserted into the integrated circuit design at step 650. After the fixes are inserted into the integrated circuit design, the timing of the integrated circuit design is reanalyzed at each node impacted by the solution to determine whether there are any additional timing fixes, whether the current solution meets all requirements and whether to perform further optimization of the current fix using the optimization method at step 670. There may be additional timing fixes that are not addressable via the optimization method; these additional timing fixes are referred to as orphan fixes.

If there are additional timing fixes to perform using the optimization method, then the system performs another iteration of the optimization method by returning to step 630. It has been empirically determined that three to four iterations generally addresses most, if not all, of the timing fixes that can be optimized. One way of determining how many iterations to perform is to iterate until the previous maximum number of violations are reached.

If there are not any additional timing fixes to perform using the optimization method, then the system proceeds to insert the orphan fixes at step 680. The execution of the system then completes.

The following example shows the operation of the method. More specifically, consider the example where the possible solutions are:
  i) 20 buffers to fix 140 paths.
  ii) 25 buffers to fix 125 paths.
  iii) 40 buffers to fix 180 paths.
  iv) 1 buffer to fix 15 paths.

Figure 7:
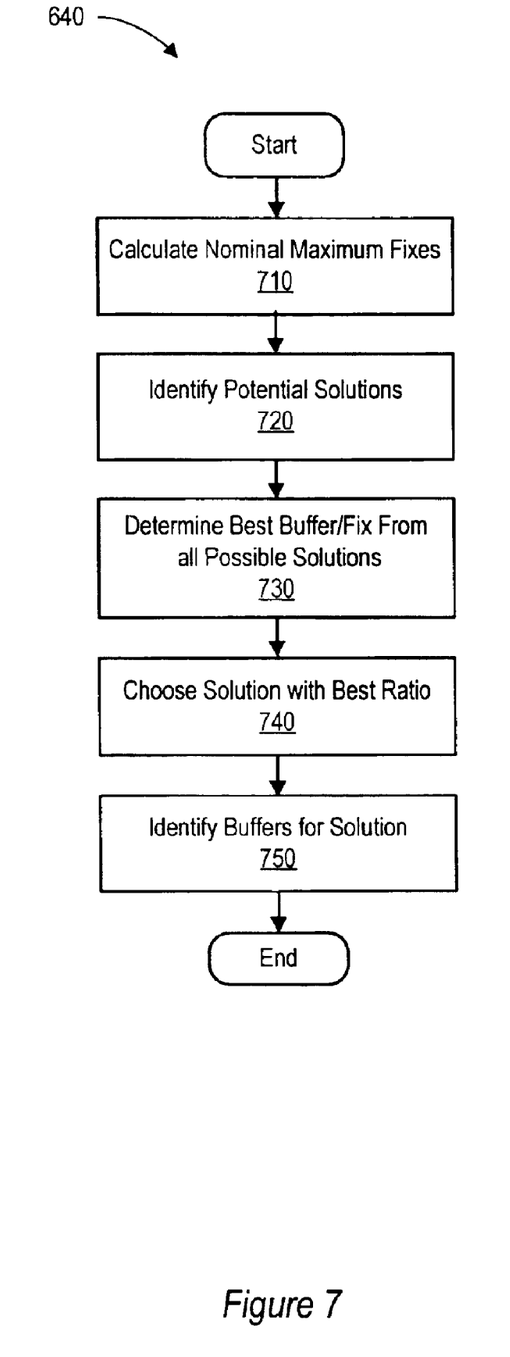
FIG. 7 shows a flow chart of the operation of choosing a solution for optimizing integrated circuit design timing fixes.

FIG. 7 shows a flow chart of the operation of choosing a solution for optimizing integrated circuit design timing fixes via a mean or median approach. More specifically, after the possible solutions are determined, then the system calculates a nominal number of fixes at step 710. This nominal maximum is selected to be the median of all possible solutions. Solutions that fix more than this median are then identified as potential solutions at step 720.

In the example, the nominal maximum=(140+125+180+15)/4=115. Thus, the potential solutions are i, ii and iii.

Next the nominal number of fixes is analyzed to determine the best buffer per fix ratio from the possible solution at step 730. In the example, the ideal was solution i which addressed 7 violations/buffers. The solution with the best ratio is selected as the solution at step 740.

Next, buffers are identified for the solution at step 750.

After all the mintime buffers are inserted in the netlist, maxtime is rerun to verify where there are any maxtime violations, and any buffer causing maxtime violation are removed from the netlist to determine the final netlist used in the design.

Figure 8:
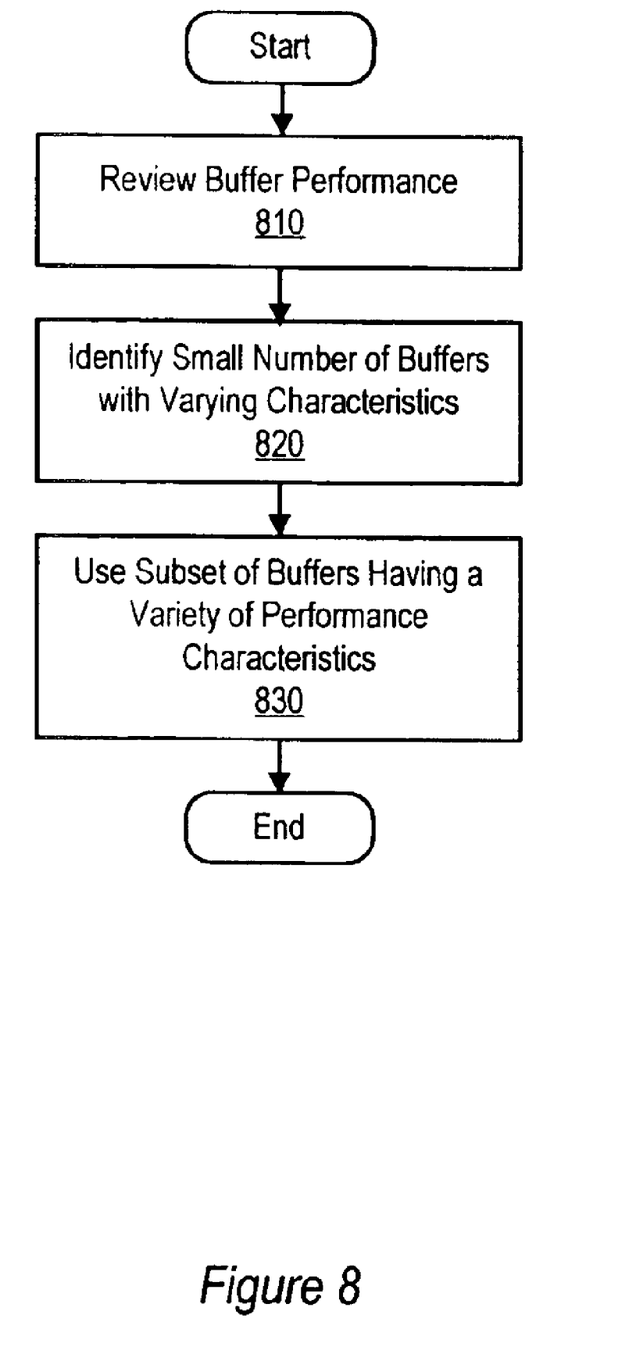
FIG. 8 shows a flow chart of choosing buffers for use in the solution for optimizing integrated circuit design timing fixes.

Referring to FIG. 8, a flow chart of choosing buffers for use in the solution for optimizing integrated circuit design timing fixes is shown. More specifically, the buffer performance for all available buffers is reviewed at step 810. From the buffer performance, a smaller number of buffers having varying characteristics are identified at step 820.

When selecting the smaller number of buffers a plurality of criteria are reviewed. For example, the first order delay is calculated at both the mintime and the maxtime corner for each buffer. Also, the maxtime slacks for each buffer is analyzed. The maxtime slack is the difference between the cycle time and the maximum delay time of the buffer. Also, the buffer's drive strength to determine whether the buffer has a desired drive strength.

A simple first order delay calculation may be used to determine the first order delay for the buffer at maxtime and mintime corners. More specifically, $$Td = Tintrinsic + Rout(Cload)$$

Td is the timing delay. Tintrinsic is the intrinsic delay of a gate. The intrinsic delay is defined as the delay of a gate when there is no load connect at the output of the gate. The intrinsic delay is calculated from a timing module that is associated with the buffer within the buffer library.

Rout is the drive strength reflected in terms of resistance units or drive resistance of the gate output. Cload is the output capacitance load connected to the gate. The Rout is calculated from a timing model that is associated with the buffer within the buffer library. The loads for the buffer are calculated from the timing reports based on actual netlists for the integrated circuit design.

Based on this intrinsic delay at both mintime and maxtime corner. The buffer is evaluated.

The maxtime slacks for the buffer are determined from a timing report for the integrated circuit design. The buffer is analyzed to determine whether the following condition is met:

$$Tdelay\ (max) < Tslack\ (max)\ \&\&$$

$$Tdelay\ (min) >= T(violation)$$

If this condition is not met, the buffer in the loop is not evaluated. The drive strength of the buffer is maintained to be the same as the stage before the buffer insertion point. After the small number of buffers are identified, the system uses these small number of buffers for the timing fixes at step 830. Accordingly, a subset of all buffers available may be used to provide timing fixes to the integrated circuit using the described optimization method. This subset of buffers represents a variety of performance characteristics. For example, larger buffers with more delay or greater drive strength may be used during the first iteration of the method whereas smaller buffers may be used during follow on iterations. Thus the timing of the integrated circuit may be optimized using a relatively small number of different buffer types.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, another approach for determining a solution for optimizing integrated circuit design timing fixes is via an acquisitive or greedy approach. Using the acquisitive approach, the solution which addresses the greatest number of timing issues is chosen during each iteration of the process. In the above example, the acquisitive approach would select solution iii which would fix the greatest number of violations with a single iteration.

Also, the above-discussed embodiments include software modules that perform certain tasks. The software modules discussed herein may include script, batch, or other executable files. The software modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module.

What is claimed is:

1. A method for optimizing buffers in an integrated circuit design comprising:

identifying paths and nodes within the integrated circuit design;

determining node overlap within the integrated circuit design;

calculating possible solutions for addressing timing violations within the integrated circuit design;

choosing a solution for addressing timing violations, the choosing a solution being based upon fixing a plurality of timing violations based upon various input criteria;

inserting buffers at particular nodes of the integrated circuit design; and, repeating the calculating possible solutions, the choosing a solution and the inserting buffers at particular nodes to address timing violations within the integrated circuit design; and wherein the various input criteria include a median approach, the median approach including calculating a nominal number of fixes for addressing timing violations from the calculating possible solutions and then selecting an approach for addressing timing violations which fixes more than the nominal number of fixes.

2. The method for optimizing buffers in an integrated circuit design of claim 1 wherein the repeating continues until a previous maximum number of violations have been addressed.

3. The method for optimizing buffers in an integrated circuit design of claim 2 wherein after the repeating, there are orphan timing violations remaining to be addressed; and, further comprising inserting buffers at particular locations to address the orphan timing violations.

4. The method for optimizing buffers in an integrated circuit design of claim 1 further comprising:

identifying buffers from a list of potential buffers available to insert into the integrated circuit design; and choosing a subset of the buffers from the list as buffers for inserting at the particular nodes of the integrated circuit.

5. The method for optimizing buffers in an integrated circuit design of claim 4 wherein:

factors used in choosing a subset of the buffers from the list as buffers include a first order delay characteristic of the buffer, a maximum time slack characteristic of the buffer, and a drive strength characteristic of the buffer.

6. A method for optimizing buffers in an integrated circuit design comprising:

identifying paths and nodes within the integrated circuit design;

determining node overlap within the integrated circuit design;

calculating possible solutions for addressing timing violations within the integrated circuit design;

choosing a solution for addressing timing violations, the choosing a solution being based upon fixing a plurality of timing violations based upon various input criteria;

inserting buffers at particular nodes of the integrated circuit design; and, repeating the calculating possible solutions, the choosing a solution and the inserting buffers at particular nodes to address timing violations within the integrated circuit design; and wherein the various input criteria include an acquisitive approach, the acquisitive approach including determining which solution from the calculating possible solutions fixes a greatest number of timing violations and then selecting an approach for addressing timing violations which fixes the greatest number of timing violations.

7. An apparatus for optimizing buffers in an integrated circuit design comprising:

means for identifying paths and nodes within the integrated circuit design;

means for determining node overlap within the integrated circuit design;

means for calculating possible solutions for addressing timing violations within the integrated circuit design;

means for choosing a solution for addressing timing violations, the choosing a solution being based upon fixing a plurality of timing violations based upon various input criteria;

means for inserting buffers at particular nodes of the integrated circuit design; and, means for repeating the calculating possible solutions, the choosing a solution and the inserting buffers at particular nodes to address timing violations within the integrated circuit design; and wherein the various input criteria include a median approach, the median approach including calculating a nominal number of fixes for addressing timing violations from the calculating possible solutions and then selecting an approach for addressing timing violations which fixes more than the nominal number of fixes.

8. The apparatus for optimizing buffers in an integrated circuit design of claim 7 wherein the repeating continues until a previous maximum number of violations have been addressed.

9. The apparatus for optimizing buffers in an integrated circuit design of claim 8 wherein after the repeating, there are orphan timing violations remaining to be addressed; and, further comprising means for inserting buffers at particular locations to address the orphan timing violations.

10. The apparatus for optimizing buffers in an integrated circuit design of claim 7 further comprising:

means for identifying buffers from a list of potential buffers available to insert into the integrated circuit design; and means for choosing a subset of the buffers from the list as buffers for inserting at the particular nodes of the integrated circuit.

11. The apparatus for optimizing buffers in an integrated circuit design of claim 10 wherein:

factors used in choosing a subset of the buffers from the list as buffers include a first order delay characteristic of the buffer, a maximum time slack characteristic of the buffer, and a drive strength characteristic of the buffer.

12. An apparatus for optimizing buffers in an integrated circuit design comprising:

means for identifying paths and nodes within the integrated circuit design;

means for determining node overlap within the integrated circuit design;

means for calculating possible solutions for addressing timing violations within the integrated circuit design;

means for choosing a solution for addressing timing violations, the choosing a solution being based upon fixing a plurality of timing violations based upon various input criteria;

means for inserting buffers at particular nodes of the integrated circuit design; and, means for repeating the calculating possible solutions, the choosing a solution and the inserting buffers at particular nodes to address timing violations within the integrated circuit design; and wherein the various input criteria include an acquisitive approach, the acquisitive approach including determining which solution from the calculating possible solutions fixes a greatest number of timing violations and then selecting an approach for addressing timing violations which fixes the greatest number of timing violations.

13. A system for optimizing buffers in an integrated circuit design comprising:

an identifying module, the identifying module identifying paths and nodes within the integrated circuit design;

a determining module, the determining module determining node overlap within the integrated circuit design;

a calculating module, the calculating module calculating possible solutions for addressing timing violations within the integrated circuit design;

a choosing module, the choosing module choosing a solution for addressing timing violations, the choosing a solution being based upon fixing a plurality of timing violations based upon various input criteria;

an inserting module, the inserting module inserting buffers at particular nodes of the integrated circuit design; and, a repeating module, the repeating module repeating the calculating possible solutions, the choosing a solution and the inserting buffers at particular nodes to address timing violations within the integrated circuit design; and wherein the various input criteria include a median approach, the median approach including calculating a nominal number of fixes from the calculating possible solutions for addressing timing violations and then selecting an approach for addressing timing violations which fixes more than the nominal number of fixes.

14. The system for optimizing buffers in an integrated circuit design of claim 13 wherein
the repeating continues until a previous maximum number of violations have been addressed.

15. The system for optimizing buffers in an integrated circuit design of claim 14 wherein
after the repeating, there are orphan timing violations remaining to be addressed; and, further comprising
an orphan inserting module, the orphan inserting module inserting buffers at particular locations to address the orphan timing violations.

16. The system for optimizing buffers in an integrated circuit design of claim 7 further comprising:
an identifying module, the identifying module identifying buffers from a list of potential buffers available to insert into the integrated circuit design; and
a subset choosing module, the subset choosing module choosing a subset of the buffers from the list as buffers for inserting at the particular nodes of the integrated circuit.

17. The system for optimizing buffers in an integrated circuit design of claim 16 wherein:
factors used in choosing a subset of the buffers from the list as buffers include a first order delay characteristic of the buffer, a maximum time slack characteristic of the buffer, and a drive strength characteristic of the buffer.

18. A system for optimizing buffers in an integrated circuit design comprising:
an identifying module, the identifying module identifying paths and nodes within the integrated circuit design;
a determining module, the determining module determining node overlap within the integrated circuit design;
a calculating module, the calculating module calculating possible solutions for addressing timing violations within the integrated circuit design;
a choosing module, the choosing module choosing a solution for addressing timing violations, the choosing a solution being based upon fixing a plurality of timing violations based upon various input criteria;
an inserting module, the inserting module inserting buffers at particular nodes of the integrated circuit design; and,
a repeating module, the repeating module repeating the calculating possible solutions, the choosing a solution and the inserting buffers at particular nodes to address timing violations within the integrated circuit design; and wherein,
the various input criteria include an acquisitive approach, the acquisitive approach including determining which solution from the calculating possible solutions fixes a greatest number of timing violations and then selecting an approach for addressing timing violations which fixes the greatest number of timing violations.

* * * * *